United States Patent
Cavalloni et al.

(10) Patent No.: US 7,548,012 B2
(45) Date of Patent: Jun. 16, 2009

(54) MULTI-LAYER PIEZOELECTRIC MEASURING ELEMENT, AND PRESSURE SENSOR OR FORCE SENSOR COMPRISING SUCH A MEASURING ELEMENT

(75) Inventors: Claudio Cavalloni, Regensdorf (CH); Kurt Vollenweider, Humlikon (CH); Roland Sommer, Seuzach (CH)

(73) Assignee: Kistler Holding, AG, Winterthur (CH)

( * ) Notice: Subject to any disclaimer, the term of this patent is extended or adjusted under 35 U.S.C. 154(b) by 78 days.

(21) Appl. No.: 10/572,015

(22) PCT Filed: Sep. 10, 2004

(86) PCT No.: PCT/CH2004/000571
§ 371 (c)(1),
(2), (4) Date: Oct. 19, 2006

(87) PCT Pub. No.: WO2005/026678
PCT Pub. Date: Mar. 24, 2005

(65) Prior Publication Data
US 2007/0199376 A1    Aug. 30, 2007

(30) Foreign Application Priority Data
Sep. 17, 2003    (CH) .................................. 1585/03

(51) Int. Cl.
*H01L 41/047* (2006.01)
*H01L 41/083* (2006.01)
*H01L 41/113* (2006.01)
(52) U.S. Cl. ....................................... 310/338; 310/359
(58) Field of Classification Search ................. 310/338, 310/339, 359, 368
See application file for complete search history.

(56) References Cited

U.S. PATENT DOCUMENTS 2,410,825 A  *  11/1946  Lane ........................... 310/352
3,233,466 A  *   2/1966  Shaw, Jr. .................. 73/514.29

(Continued)

FOREIGN PATENT DOCUMENTS

GB           1054081           1/1967

(Continued)

OTHER PUBLICATIONS

PCT International Search Report, WO2005/026678 A1 dated Dec. 2, 2004.

*Primary Examiner*—Thomas M Dougherty
(74) *Attorney, Agent, or Firm*—Dority & Manning, P.A.

(57) ABSTRACT

A piezoelectric measuring element (9) consists of at least two piezoelectric crystals (1) showing a transversal effect for the measurement of axially acting forces and/or pressures as well as to a pressure or force sensor comprising said element. The crystals (1) with transversal effect having an opposite polarization (4) to each other are attached to each other by means of a lateral electrode (12). In this manner, if n crystals (1) are attached to each other, a single multi-layer measuring element (9) is obtained with a stability under load which is n-times that of an individual crystal. Preferably, the electrodes extend alternately into the two force-absorbing end faces (3) of the crystals. Such measuring elements can be fabricated from wafers (15) in a cost-effective manner. A compact multi-layer measuring element prepared in this way can be easily mounted in a sensor, particularly a force or pressure sensor, without the risk of inclination.

18 Claims, 3 Drawing Sheets

U.S. PATENT DOCUMENTS

| | | | | |
|---|---|---|---|---|
| 3,281,612 A | * | 10/1966 | Hatschek | 310/338 |
| 3,351,787 A | * | 11/1967 | Kistler | 310/329 |
| 3,673,442 A | * | 6/1972 | Sonderegger | 310/329 |
| 3,940,974 A | * | 3/1976 | Taylor | 374/177 |
| 4,494,409 A | | 1/1985 | Kondo et al. | |
| 4,667,127 A | | 5/1987 | Krempl et al. | |
| 4,769,882 A | * | 9/1988 | Rosen et al. | 29/25.35 |
| 4,902,926 A | | 2/1990 | Engel et al. | |
| 5,430,342 A | * | 7/1995 | Watson | 310/316.01 |
| 5,515,725 A | * | 5/1996 | Tabota et al. | 73/514.34 |
| 6,239,534 B1 | * | 5/2001 | Takeuchi et al. | 310/328 |
| 6,777,856 B2 | * | 8/2004 | Brechbuhl et al. | 310/328 |

FOREIGN PATENT DOCUMENTS

| | | | | |
|---|---|---|---|---|
| JP | | 4-346041 | * 12/1992 | 310/338 |

* cited by examiner (a)

(b)

(a)

(b)

MULTI-LAYER PIEZOELECTRIC MEASURING ELEMENT, AND PRESSURE SENSOR OR FORCE SENSOR COMPRISING SUCH A MEASURING ELEMENT

CROSS-REFERENCE TO RELATED APPLICATIONS

This application claims priority from previously filed PCT application number PCT/CH2004/000571 filed on Sep. 10, 2004, which claims priority from CH 01585/03, filed Sep. 17, 2003.

STATEMENT REGARDING FEDERALLY SPONSORED RESEARCH OR DEVELOPMENT

N/A

BACKGROUND OF THE INVENTION

The invention relates to a piezoelectric measuring element consisting of at least two piezoelectric crystals showing a transversal effect for the measurement of axially acting forces and/or pressures as well as to a pressure or force sensor comprising said element.

Piezoelectric crystals are widely used in sensors for the measurement of forces, pressures, acceleration, elongations, and moments or combinations thereof. For this purpose, for example crystals showing a transversal effect are cut into thin plates or bars. If used in measuring technology, such thin plates or strips are for example exposed to an axially acting force, i.e. a force that acts on two opposite end faces of a plate or a strip. If a crystal with transversal effect is concerned, an electric charge accumulates under the force on the two major lateral surfaces of the plates or strips. On electrically conductive layers, so-called electrodes, applied to these two lateral surfaces and being not in electrical contact with each other these charges are collected and transmitted by means of the respective device within the sensor. Eventually, a suitable unit detects the signal generated by these charges from the sensor whereby information with respect to the force can be obtained. In this regard, the polarization describes the direction of each electrode negatively charged under the acting force with respect to each positively charged electrode.

Measuring elements of this type are sufficiently known and are for example described in the publication published 1988 "PIEZOXIDE (PXE)" BY VALVO, a division of Phillips GmbH, Essen, or 2002 in "Piezielectric Sensorics", by G. Gautschi, published by Springer Verlag.

It is critical for the quality of a sensor that each of the crystals is incorporated perpendicularly and centered parallel to the sensor axis. A slightly inclined position will result in an incorrect measurement or in breakage of the crystal under the action of the forces to be applied later.

The sensitivity of this sensor is proportional to the relationship between the bar length to the bar thickness of the crystal. In this respect, the length of the bar is defined by the distance between the end faces leading the force into the crystal and the thickness through the distance between the end faces where the charges accumulate under a force. The thinner a crystal is the higher is therefore its sensitivity at an identical length. On the other hand, the maximum stability under load of thin plates is smaller than that of thick plates because they break more easily.

In FIGS. 1 to 4, the direction of the arrows designated by the numeral 4 always shows the direction of the polarization 4 of a piezoelectric crystal from minus to plus. The faces of the crystals acquiring a positive (+) or a negative (−) charge under a force are coated with electrodes. Those electrodes acquiring a positive charge under a force are always shown hatched with a solid outline; those electrodes acquiring a negative charge under a force are always shown dotted with a dotted outline. The directions of polarization and thus also positive and negative charges were chosen voluntarily for the representation and can be reversed or exchanged, respectively, in each of the Figures.

FIG. 1 shows the representation of a known simple piezoelectric measuring element 1 with transversal effect. The end face 3 which is the major one in this embodiment is advantageous for easy centering during the incorporation into the sensor housing. Since the sensitivity is proportional to the mean thickness d of the crystal it is not very high.

In order to increase the sensitivity, the crystal 1 can be made thinner. FIG. 2 shows such a crystal 1 which is also known in the form of a thin plate. The higher sensitivity due to the small thickness d, however, reduces the simplicity of centering during mounting into a sensor. Furthermore, the maximum stability under load is limited since this thin crystal 1 breaks easily.

To create a high sensitivity and simultaneously a high stability under load several thin crystals can be fitted into the same sensor. The maximum stability under load of the sensor thus multiplies by the number of crystals introduced while the sensitivity is the same as if only a single crystal having the same thickness was used. Taking into account the force shunt, however, the sensitivity will be higher since the stiffness of the sum of the crystals is increased by the number of crystals.

A known arrangement consists of three crystals having the cross section of circle segments or rectangles. These are arranged in a spherical sensor in a way that a triangle is provided in the centre. Such arrangements are for example known from CH 392 103.

FIGS. 3 (a) and (b) show a known measuring element 2 consisting of three crystals 1 having the same lengths. They have a cross sectional area 5 corresponding to a circle segment and are arranged such that they can be placed into a spherical sensor housing while a triangular area 6 remains in the centre. Under a force, the electrodes on the surfaces facing the interior all collect the same charge which in this embodiment is received by an electrically conductive spiral spring 7 represented in FIG. 3b. The charge of the electrodes on the outer surface of the crystal is received by the casing of the spherical sensor housing onto which the crystals 1 are pressed by the spiral spring 7. A measuring element 2 of this type is characterized by its high stability under load and high sensitivity. Fabrication and mounting and also the centering, however, remain very complex.

Another known arrangement uses four thin crystal plates spaced in a side by side manner and having the same length.

The known embodiment of a measuring element 2 represented in FIGS. 4 (a) and (b) shows the same advantages and disadvantages as the embodiment of FIG. 3. In this case for example four crystals 1 having the same height are spaced in a side by side manner each having an opposite polarization direction 4. For the withdrawal of charge, a spring 8 in the form of a corrugated sheet is placed between each two of the adjacent crystals 1 as shown in FIG. 4b. Such a spring 8 always ensures a good contact for charge transmission.

Mounting and particularly centering of the crystals, however, is even more difficult in these multiple crystal arrangements.

During mounting care must be taken in these two cases that both electrodes of each crystal are perfectly connected with the lines within the sensor.

OBJECTS AND SUMMARY OF THE INVENTION

It is an object of the present invention to describe a piezoelectric measuring element as mentioned in the introduction which can be easily centered and connected in a sensor. It is another object to describe a sensor comprising said measuring element.

These objects have been achieved according to the invention by the features of the independent claims.

According to the invention, the crystals showing a transversal effect and each having an opposite polarization are attached to each other by means of a lateral electrode.

Preferably, thin crystals are used to increase the sensitivity of the measuring element. There is an electrode between adjacent crystals by which the two crystals are attached to each other. In this manner, if n crystals are attached to each other, there is obtained a single multi-layer measuring element with a stability under load which is n-times that of an individual crystal. Preferably the electrodes extend alternately into the two force-absorbing end faces of the crystals. The electrodes are connected to each other such that with each axially introduced force a corresponding force signal can be obtained from the measuring element. Such measuring elements can be fabricated from wafers in a cost-effective manner. A compact multi-layer measuring element prepared in this way can be easily mounted and centered in a sensor, particularly a force or pressure sensor, without the risk of inclination since the measuring element has an n-times broader basis compared to the end face of an individual crystal. Such sensors are characterized by a high stability under load and a high sensitivity, and are in addition cost-effective due to the simple preparation and mounting of the measuring elements incorporated therein.

BRIEF DESCRIPTION OF THE DRAWINGS

The invention will be described with respect to the following drawings in which.

DETAILED DESCRIPTION OF THE PREFERRED EMBODIMENTS

Figure 5A:
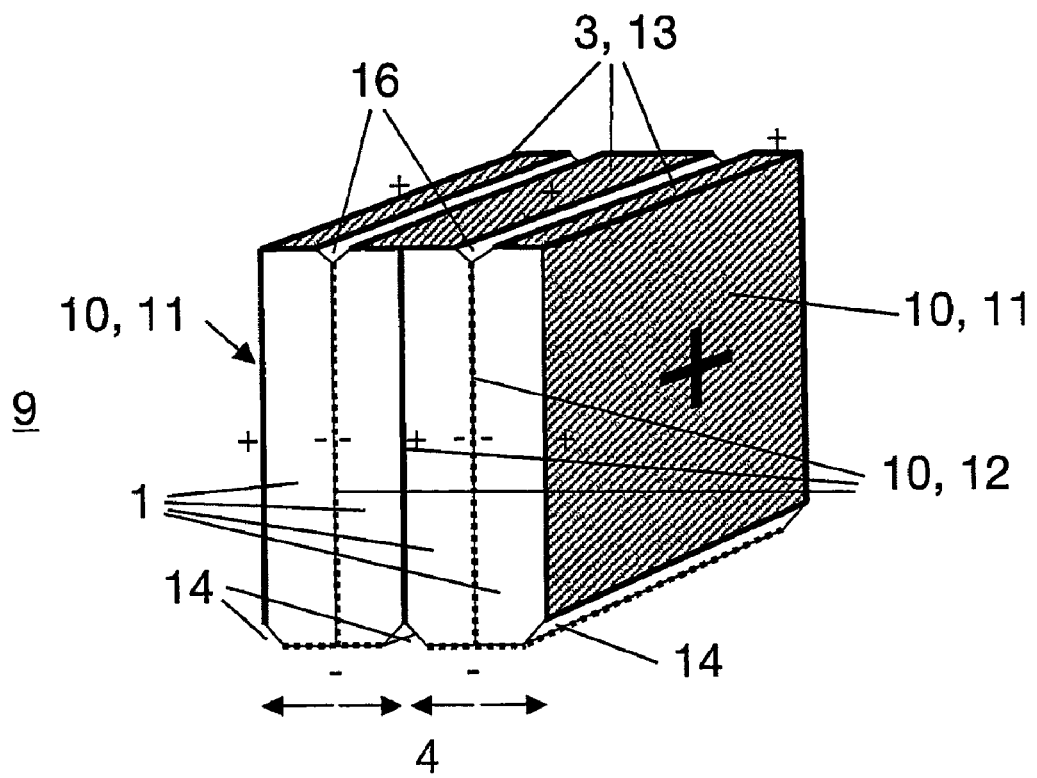
FIG. 5 shows a schematic perspective representation of a highly sensitive piezoelectric measuring element according to the invention represented (a) viewed from the top and (b) from the bottom.
Figure 5B:
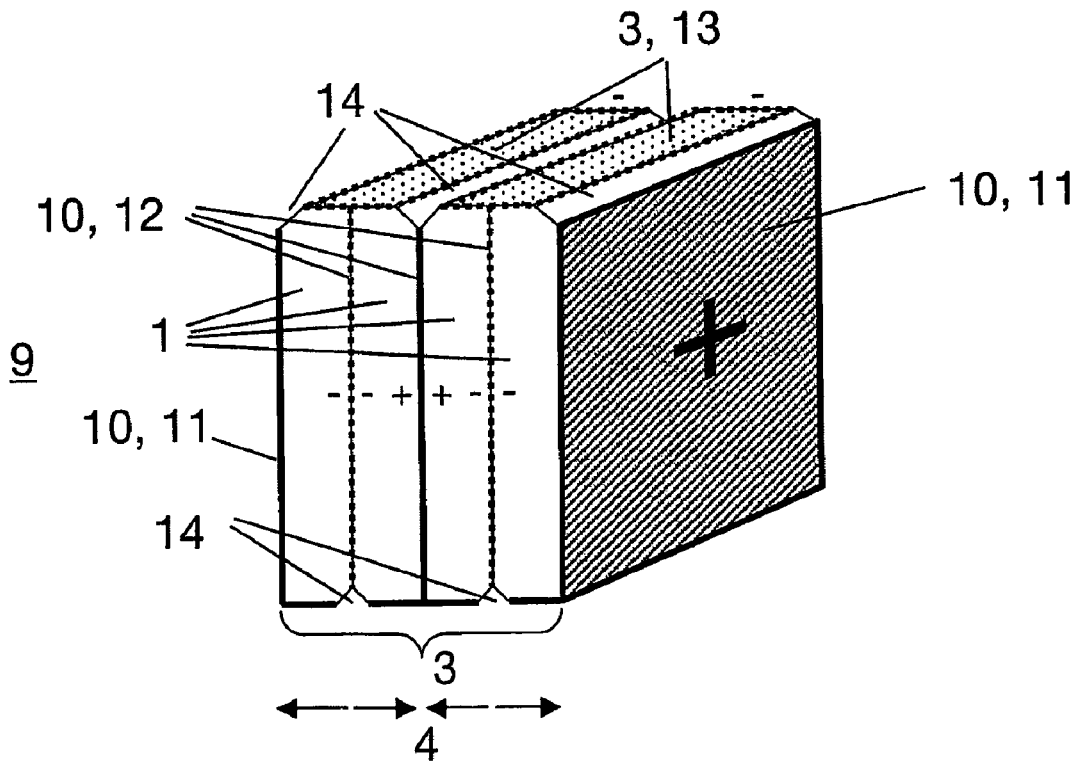

In FIGS. 5a through 5b, the direction of the arrows designated by the numeral 4 always shows the direction of the polarization 4 of a piezoelectric crystal from minus to plus. The faces of the crystals acquiring a positive (+) or a negative (−) charge under a force are coated with electrodes. Those electrodes acquiring a positive charge under a force are always shown hatched with a solid outline; those electrodes acquiring a negative charge under a force are always shown dotted with a dotted outline. The directions of polarization and thus also positive and negative charges were chosen voluntarily for the representation and can be reversed or exchanged, respectively, in each of the Figures.

FIGS. 5a and 5b represent an embodiment of a measuring element 9 according to the invention viewed from two sides which are vertically rotated by 180° with respect to each other. This schematically represented measuring element 9 consists of at least two piezoelectric crystals 1 arranged directly adjacent to each other and having a transversal effect. The crystals 1 in this embodiment are preferably not thicker than 0.5 mm and are preferably formed as plates. All side faces which can acquire an electrical charge under a force are coated with a lateral electrode 10. Except the two terminal lateral electrodes 11, each of the other central electrodes 12 connect two adjacent crystals 1 firmly with each other. The connection by the electrode must be firm enough to be not disconnected under the maximum load to which the measuring element 9 shall be exposed and within the whole temperature range permitted for the measuring element. This connection can be for example achieved by bonding, soldering or thermocompression. However, it is important that two adjacent crystals 1 are arranged with opposite polarization directions 4 to each other. Those crystals can be particularly used which achieve a temperature-independent effect.

For the withdrawal of charge, the end faces 3 of the crystals absorbing the force under a load are preferably also coated with an electrically conductive material. In this manner, the end face electrodes 13 are formed. Since the lateral electrodes 10 contain alternately opposite charges during a measurement it is absolutely required to ensure that neighbouring electrodes 10 are always insulated from each other. For this purpose, the lateral electrodes 10 are insulated in an alternating manner from the upper and the lower of the end face electrodes 13, respectively. This is preferably performed by the application of a notch-like phase 14. In this manner positive charges accumulate under a load on one of the end faces 3 while negative charges accumulate on the opposite end face 3 of the measuring element 9. At these end face electrodes 13, the transmission of charge can be conveniently performed from all lateral electrodes 10 without having to generate additional connection sites to the electrodes between the crystals. A measuring element connected in this way is suitable for the measurement of axially acting forces or pressures.

It is the advantage of such a measuring element 9 that it on the one hand is characterized by a high stability under load and a high sensitivity. On the other hand mounting and particularly centering in a sensor is very simple since the measuring element 9 consists of a single part having a large basis. In contrast, the arrangements shown in FIGS. 3 and 4 consist of the individual crystals 1 and the resilient connecting electrodes 7, 8 which must ensure the contact. Since the crystals in the embodiment according to the invention are immediately adjacent to each other, more crystals can be used on the same basis 3 compared to an embodiment according to FIG. 4.

Figure 1:
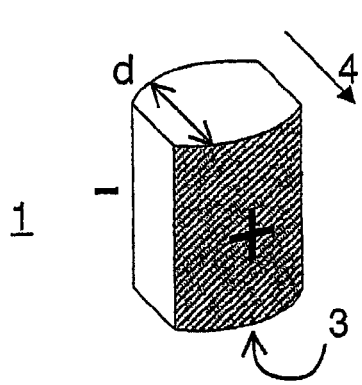
FIG. 1 shows a schematic perspective representation of a less sensitive piezoelectric crystal according to the prior art.
Figure 2:
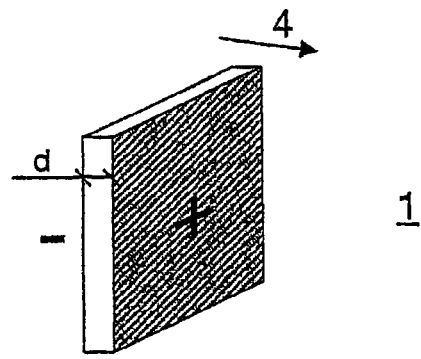
FIG. 2 shows a schematic perspective representation of a highly sensitive piezoelectric crystal with low maximum stability to load according to the prior art.
Figure 3:
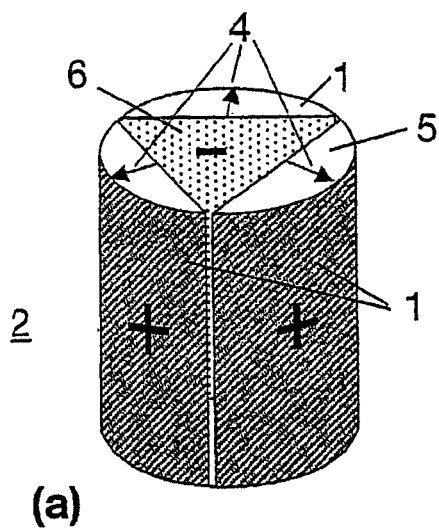
FIG. 3 shows a schematic representation of a highly sensitive piezoelectric measuring element having a high maximum stability under load according to the prior art represented in a perspective side view (a) and in a top view (b)
Figure 3:
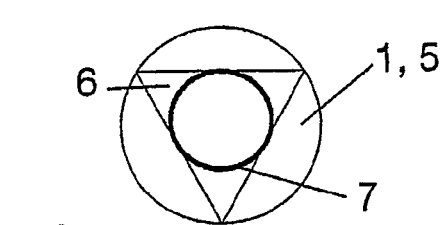
Figure 4:
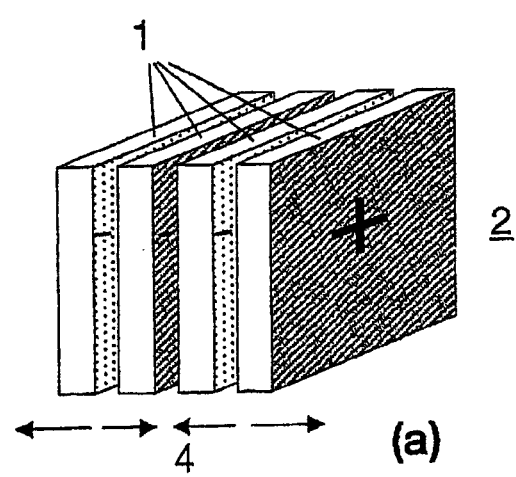
FIG. 4 shows a schematic representation of another highly sensitive piezoelectric measuring element having a high maximum stability under load according to the prior art represented in a perspective side view (a) and in a top view (b)
Figure 4:
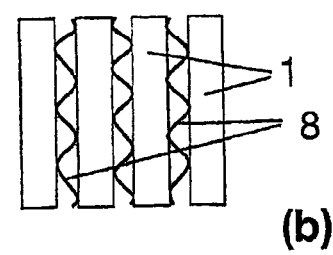

Another advantage of this arrangement as compared to the arrangements of FIGS. 3 and 4 is that the transmission of charge can be performed from a plane and not at one point or along a line. This prevents the damage of the electric contact by abrasion resulting from vibrations.

Figure 6:
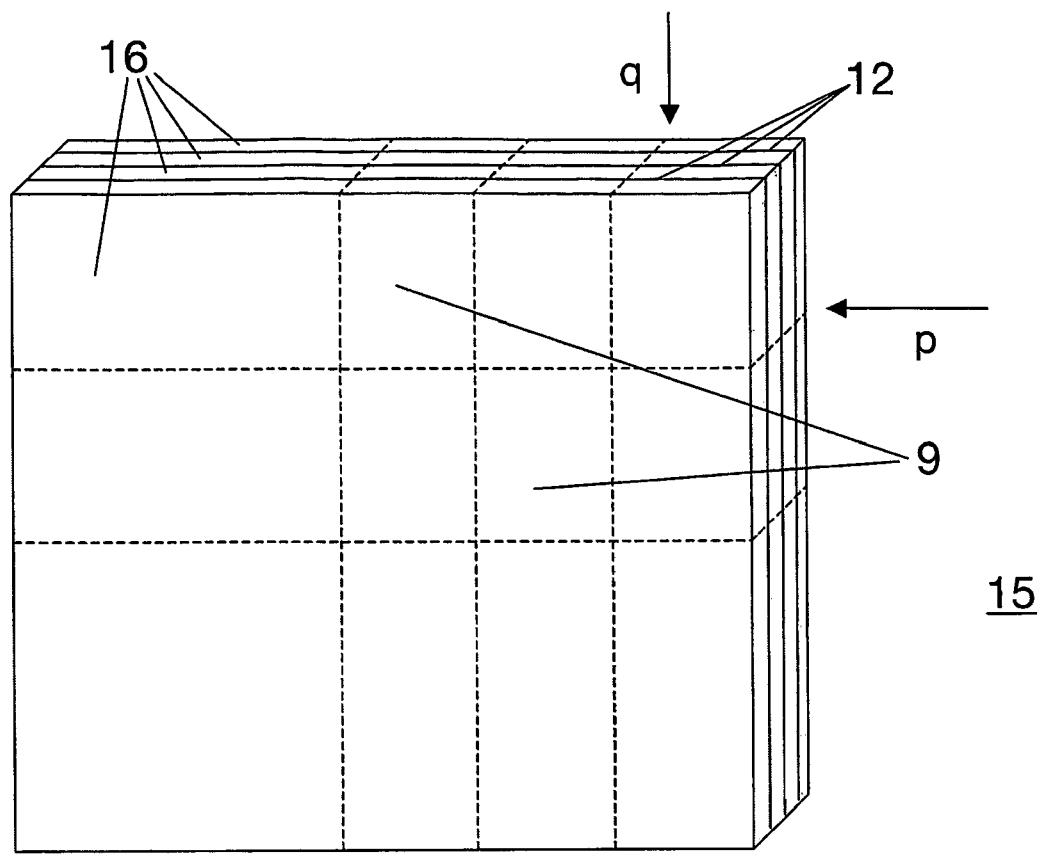
FIG. 6 shows a schematic perspective representation of a wafer for highly sensitive piezoelectric measuring elements according to the invention.

Another advantage of this arrangement is the simple and cost-effective production of such a measuring element 9 according to the invention since it can be prepared from a wafer 15. FIG. 6 shows an example of such a wafer 15. This wafer 15 is for example made from four large-surface piezoelectric crystals plates having a transversal effect 16. They are arranged with opposite polarization and are connected to each other by means of an electrically conductive layer 12, the electrodes. Preferably, this layer consists essentially of copper, gold, silver, platinum, or palladium or an alloy thereof. By cutting the wafer along the dashed lines p and q a plurality of identical measuring elements 9 is obtained.

Figure 7:
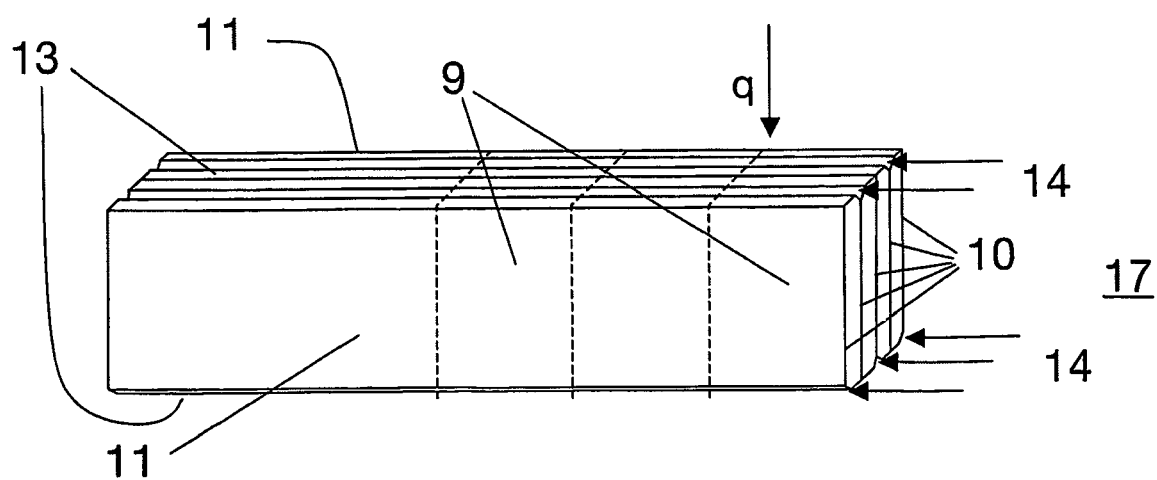
FIG. 7 shows a schematic perspective representation of a part of a wafer for highly sensitive piezoelectric measuring elements according to the invention.

FIG. 7 shows a part of a wafer 15, an array 17, formed after cutting the wafer in a direction (p). Such an array 17 is coated on its four major faces with an electrically conductive layer. In this way the two terminal lateral electrodes 11 of the resulting measuring elements 9 as well as the end face electrodes 13 are formed.

To insulate the electrodes 10 acquiring different charges during a measurement from each other notch-like phases 14 are attached to the array 17 at every second contact line between a lateral electrode 10 and an end face electrode 13 whereby each of the lateral electrodes 10 makes electrical contact to exactly one end face electrode 13 and is electrically insulated to the other due to the notch-like phase 14. This particularly applies also to the two terminal lateral electrodes 11. Along the remaining dashed lines (q), the array 17 is cut into the finished measuring elements 9.

Measuring elements of this type can be easily fitted into sensors, preferably force or pressure sensors. Such sensors are characterized by a high stability under load and a high sensitivity and further are cost-effective due to the simple preparation and centering of the measuring elements incorporated therein.

LIST OF DESIGNATIONS 1 piezoelectric crystal with transversal effect
2 piezoelectric measuring element with transversal effect
3 end face
4 polarization direction (direction of the arrows in FIGS. 1-5)
5 cross-sectional area
6 triangular area
7 spiral spring
8 corrugated sheet-like spring
9 embodiment of a measuring element according to the invention
10 lateral electrodes
11 Lateral terminal electrodes
12 electrodes connecting two crystals with each other
13 end face electrodes
14 notch-like phase
15 Wafer
16 large-surface piezoelectric crystal plates with transversal effect
17 Array
d thickness of a crystal
p, q Cutting lines

The invention claimed is:

1. A piezoelectric measuring element, comprising: at least two piezoelectric crystals, each of the two said crystals showing a transversal effect for the measurement of axially acting forces and/or pressures, each of the two said crystals having a polarization direction, whereas the two said crystals are attached to each other having alternately opposite polarization directions, by means of a lateral electrode.

2. A measuring element according to claim 1, wherein the attachment of the electrodes with respect to the crystals has been made by bonding, soldering or thermocompression.

3. A measuring element according to claim 1, wherein each of the two crystals has a plate-like form wherein the plate plane is perpendicular to the direction of polarization and each lateral surface perpendicular to the direction of polarization of each of the two crystals is coated with a lateral electrode.

4. A measuring element according to claim 1, wherein each crystal defines a force-absorbing end face and the force-absorbing end faces are provided with an end face electrode.

5. A measuring element according to claim 4, wherein each lateral electrode is in electric contact with exactly one end face electrode wherein all end face electrodes acquiring the same charge under a force are in the same plane.

6. A measuring element according to claim 4, wherein the measuring element is made from a wafer.

7. A measuring element according to claim 4, wherein each of the lateral electrodes is electrically separated by a notch-like phase from one end face electrode.

8. A measuring element according to claim 1, wherein at least the attached lateral electrodes are essentially made from copper, gold, silver, platinum, or palladium or an alloy thereof.

9. A measuring element according to claim 1, wherein the piezoelectric crystals achieve a temperature-independent effect.

10. A pressure or force sensor comprising a piezoelectric measuring element, comprising at least two piezoelectric crystals having a transversal effect for the measurement of axially acting forces and/or pressures, wherein the said two crystals each with opposite polarization are attached to each other by means of an electrically conductive lateral electrode.

11. A sensor according to claim 10, wherein the attachment of the said electrode to the two said crystals has been made by bonding, soldering or thermocompression.

12. A sensor according to claim 10, wherein each of the two said crystals has a plate-like form wherein the plate plane is perpendicular to the direction of polarization and each lateral surface is coated with a lateral electrode perpendicularly to the direction of polarization.

13. A sensor according to claim 10, wherein each crystal defines a force-absorbing end face and wherein each of the force-absorbing end faces is provided with an end face electrode.

14. A sensor according to claim 10, wherein each lateral electrode is in electric contact with exactly one end face electrode and wherein all end face electrodes acquiring the same charge under a force are in the same plane.

15. A sensor according to claim 10, wherein at least the said lateral electrode is essentially made from copper, gold, silver, platinum, or palladium or an alloy thereof.

16. A sensor according to claim 10, wherein the measuring element is made from a wafer.

17. A sensor according to claim 10, wherein the lateral electrodes are electrically separated by notch-like phases, each notch-like phase alternating with one end face electrode.

18. A sensor according to claim 10, wherein the measuring element includes piezoelectric crystals which achieve a temperature-independent effect.

* * * * *